(12) United States Patent
Moon et al.

(10) Patent No.: US 11,547,023 B2
(45) Date of Patent: Jan. 3, 2023

(54) ROOM PORTABLE BLAST CHILLER

(71) Applicants: William Grant Moon, Provo, UT (US); Steven Victor Boyce, Spanish Fork, UT (US); Steven Joseph Parkinson, Clinton, UT (US); Sheldon K Larson, Orem, UT (US); William J Hancock, Orem, UT (US)

(72) Inventors: William Grant Moon, Provo, UT (US); Steven Victor Boyce, Spanish Fork, UT (US); Steven Joseph Parkinson, Clinton, UT (US); Sheldon K Larson, Orem, UT (US); William J Hancock, Orem, UT (US)

(73) Assignee: Reflect Scientific Inc., Orem, UT (US)

( * ) Notice: Subject to any disclaimer, the term of this patent is extended or adjusted under 35 U.S.C. 154(b) by 73 days.

(21) Appl. No.: 17/202,956

(22) Filed: Mar. 16, 2021

(65) Prior Publication Data

US 2022/0304196 A1 Sep. 22, 2022

(51) Int. Cl.
*H05K 7/20* (2006.01)
*F25B 19/00* (2006.01)
*F25B 23/00* (2006.01)
*F25B 49/00* (2006.01)
*F25D 3/10* (2006.01)

(52) U.S. Cl.
CPC ....... *H05K 7/20827* (2013.01); *F25B 19/005* (2013.01); *F25B 23/006* (2013.01); *F25B 49/005* (2013.01); *F25D 3/107* (2013.01); *H05K 7/20136* (2013.01); *H05K 7/20372* (2013.01); *H05K 7/20745* (2013.01); *F25B 2333/007* (2013.01); *F25B 2600/2515* (2013.01); *F25B 2700/2104* (2013.01); *H05K 7/2069* (2013.01)

(58) Field of Classification Search
CPC ............. H05K 7/2069; H05K 7/20827; H05K 7/20372; F25B 19/005; F25B 23/006; F25B 49/005; F25B 2333/007; F25B 2600/2515; F25B 2700/2104; F25D 3/107
See application file for complete search history.

(56) References Cited

U.S. PATENT DOCUMENTS

| | | | | |
|---|---|---|---|---|
| 5,125,237 | A * | 6/1992 | Saia, III | F25D 29/001 62/239 |
| 10,165,707 | B1* | 12/2018 | Christiansen | H05K 7/20872 |
| 2017/0234583 | A1* | 8/2017 | Moon | F25D 29/003 62/50.2 |
| 2019/0195547 | A1* | 6/2019 | Moon | F17C 9/00 |
| 2019/0322374 | A1* | 10/2019 | Moon | B64D 13/08 |

* cited by examiner

*Primary Examiner* — Zachary Pape
(74) *Attorney, Agent, or Firm* — Patent PC; Bao Tran

(57) ABSTRACT

A system includes a heat exchanger mounted to the brackets and receiving cryogen, the heat exchanger having a vertical inlet coupled in parallel to a plurality of equal size horizontal tubes each traversing a width of the heat exchanger and further coupled in parallel to a vertical outlet pipe with an outlet diameter at least twice an inlet tube diameter; a temperature sensor; a thermostat that monitors the temperature sensor and maintains a predetermined temperature set point by communicating with a solenoid valve coupled to the heat exchanger; an exhaust line coupled to the outlet pipe that expels exhaust gas outside the enclosed facility; multiple fans attached to the heat exchanger; and a fail-safe oxygen sensor to protect a biological object in the enclosed facility.

20 Claims, 5 Drawing Sheets

ROOM PORTABLE BLAST CHILLER

BACKGROUND OF THE INVENTION

There is a need in the computer industry to cool a room that is approaching critically hot temperatures. The room, filled with thousands of disk drives, known as server farms, becomes excessively hot because of the heat energy from the electronics. The facility air conditioning system will typically keep the temperature to an acceptable level. But under extreme circumstances, such as at peak use times on a hot summer day, and especially when the power company institutes brown outs, the facility is in danger of reaching high temperatures that will damage the electronic equipment. Equipment shutdowns are very costly and disappoint customers, who expect uninterrupted service.

SUMMARY

In one aspect, a system includes a heat exchanger mounted to the brackets and receiving cryogen, the heat exchanger having a vertical inlet coupled in parallel to a plurality of equal size horizontal tubes each traversing a width of the heat exchanger and further coupled in parallel to a vertical outlet pipe with an outlet diameter at least twice an inlet tube diameter; a temperature sensor; a thermostat that monitors the temperature sensor and maintains a predetermined temperature set point by communicating with a solenoid valve coupled to the heat exchanger; an exhaust line coupled to the outlet pipe that expels exhaust gas outside the enclosed facility; multiple fans attached to the heat exchanger; and a fail-safe oxygen sensor to protect a biological object in the enclosed facility.

In another aspect, the room portable blast chiller provides a solution for quickly reducing extreme temperatures in server farms and other applications. The device may be rolled into a room, the exhaust gas line placed outside, and immediately turned on, with no need to plug it in. The device has rechargeable batteries and requires no external electricity. It will quickly reduce the temperature of a room to acceptable levels in a few minutes. For example, in a computer room 16 feet by 16 feet by 8 feet high, the temperature drops from room temperature (23 C) to −40 C in 30 minutes. In the HVAC industry the invention would be considered a "Blast" Chiller, because it can cool a room extremely fast.

In yet another aspect, a chiller is mounted permanently on a wall without the nitrogen tank. A liquid nitrogen bulk tank, typically located outside the facility, would be used as the nitrogen source. Vacuum Jacketed Piping (VJP) would be installed to connect the liquid nitrogen bulk tank to the blast chiller on the wall.

Advantages may include one or more of the following. The system solves the problem of dangerous overheating in computer server farm rooms, or other rooms with critically temperature sensitive equipment, during peak use hours or brownouts. The room portable blast chiller uses cryogenic liquid nitrogen as the cooling medium and cools a room at an extremely fast rate, without the need for any external power.

BRIEF DESCRIPTION OF THE DRAWINGS

The disclosure will become more fully understood from the following detailed description, taken in conjunction with the accompanying figures, wherein like reference numerals refer to like elements, in which.

DETAILED DESCRIPTION

Figure 1:
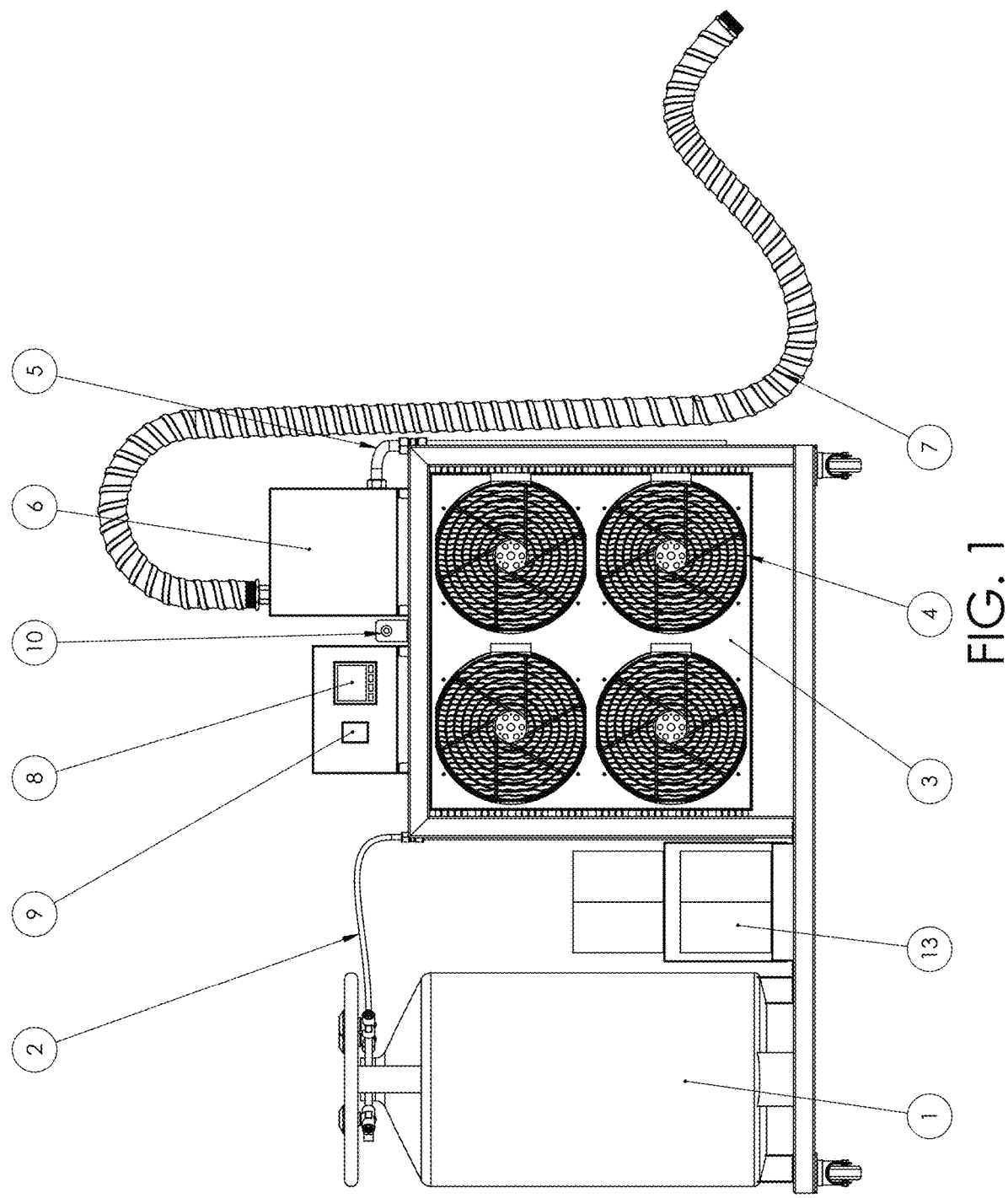
FIG. 1 shows an exemplary 3D perspective view of the room portable blast chiller.
Figure 2:
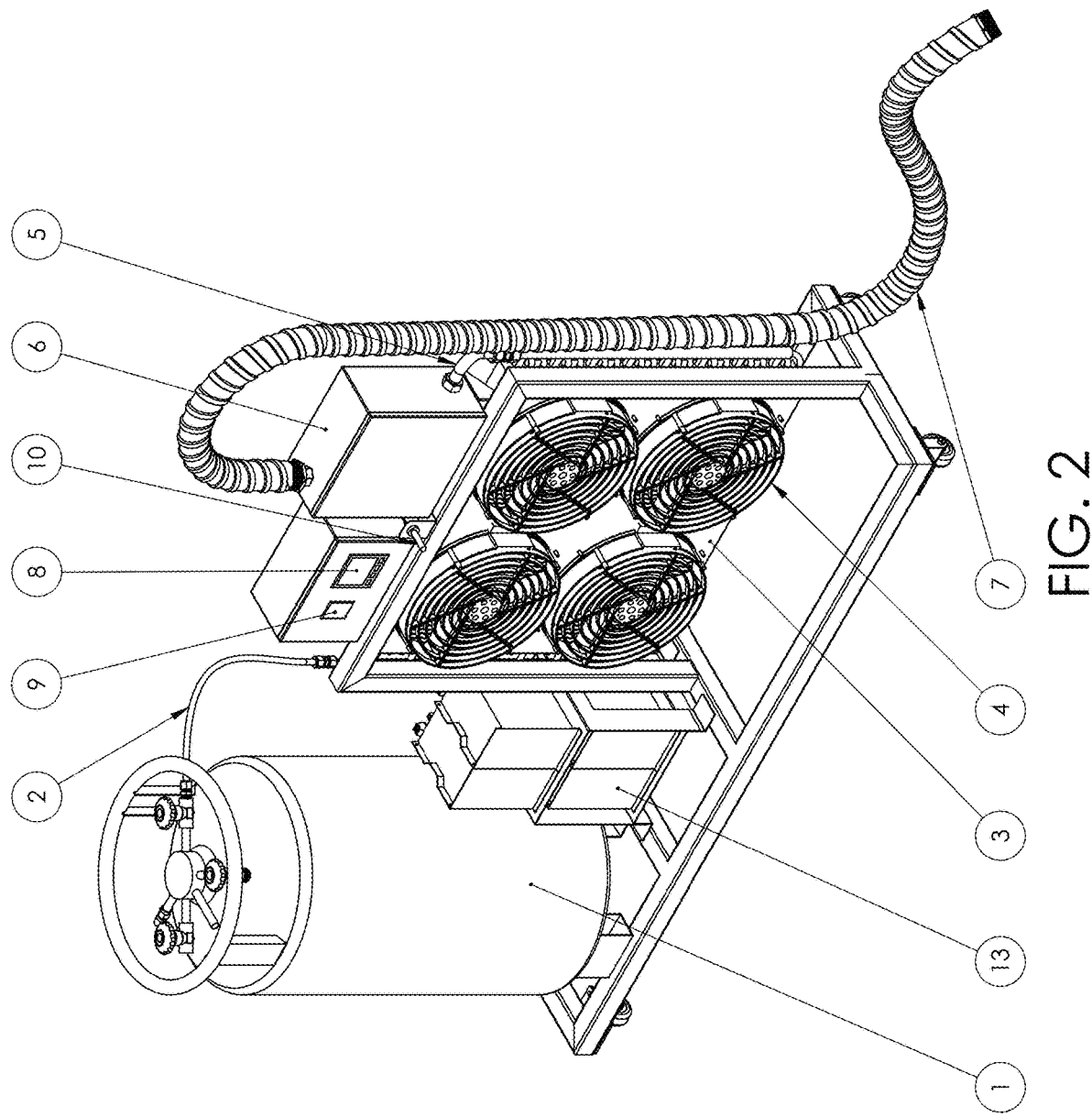
FIG. 2 shows an exemplary front view of the room portable blast chiller.
Figure 3A:
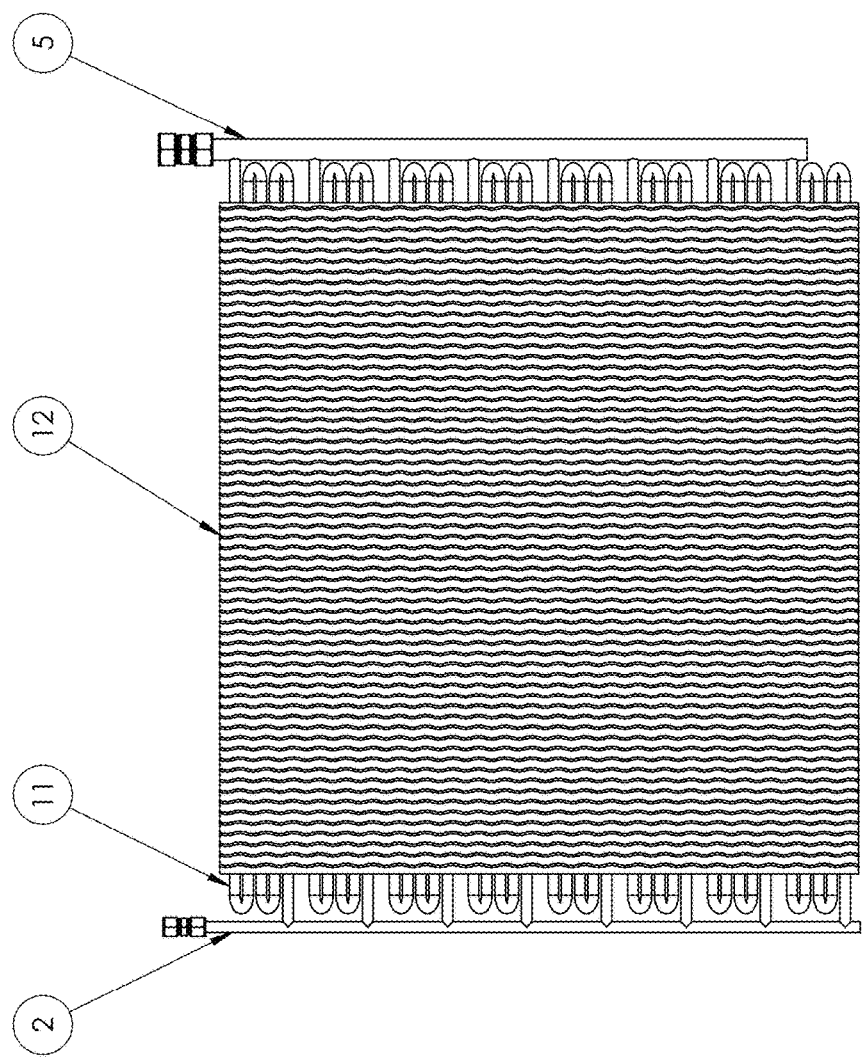
FIG. 3A shows an exemplary front view of the heat exchanger.
Figure 3B:
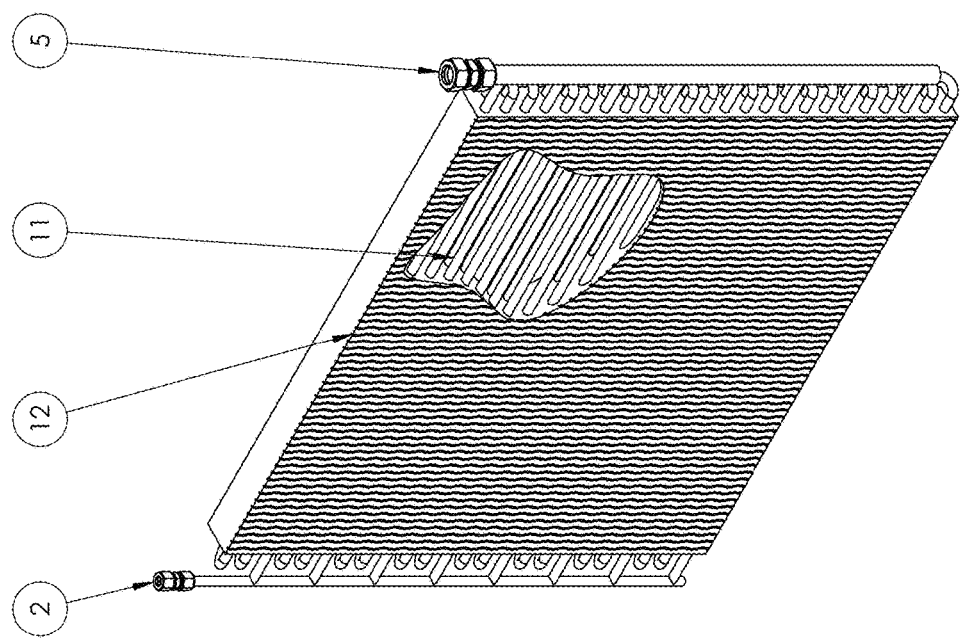
FIG. 3B shows an exemplary 3D perspective cutaway view of the horizontal copper pipes in the heat exchanger.

Before turning to the figures, which illustrate the exemplary embodiments in detail, it should be understood that the disclosure is not limited to the details or methodology set forth in the description or illustrated in the figures. It should also be understood that the terminology is for the purpose of description only and should not be regarded as limiting.

Now referring to FIGS. 1, 2, 3A and 3B, the room portable blast chiller is a cryogenic cooling system on a platform with wheels. It uses liquid nitrogen that is stored at 22 psi and a temperature of −196 C, stored in a vacuum-insulated-cryogenic tank 1, often referred to as a Dewar tank attached to the chiller or a bulk storage tank outside the facility (not shown). The device is narrow enough to fit through most doors. After the device has been wheeled into a room that requires cooling, the exhaust line 7 is routed through a window, door, or some other exit to the outside of the facility.

When the device is turned on, thermostat 8 maintains a predetermined set point. When temperature sensor 10 senses a temperature higher than the set point, thermostat 8 calls for cooling and communicates with, and energizes solenoid valve 6, which is located downstream of the heat exchanger 3. Liquid nitrogen then flows from vacuum-insulated-cryogenic tank 1, through the flexible inlet hose 2 through the heat exchanger 3, through the solenoid valve 6, and through the exhaust gas line 7 to the outside of the facility. Rechargeable batteries 13 power the fans 4, thermostat 8, solenoid valve 6, and an oxygen sensor 9.

The room portable blast chiller cools a room quickly because the device is designed for an extremely high heat transfer rate of room air through the heat exchanger 3 using multiple fans 4 and a specially designed heat exchanger 3.

The heat exchanger 3 design is key to successfully cooling a room extremely fast. The key is to design a heat exchanger that maximizes liquid nitrogen flow and keeps the liquid nitrogen as a liquid throughout the heat exchanger as long as possible! The temperature differential between the liquid nitrogen at −196 C and the warm room at a given 40 C is huge and provides the thermal power to instantly cool a room quickly. When the nitrogen phase changes to a gas, the gas molecules are further apart than the liquid nitrogen molecules, and will not absorb heat as quickly as liquid nitrogen. A heat exchanger design that optimizes liquid nitrogen flow, while keeping the nitrogen in a liquid state as long as possible, is demonstrated in FIG. 3*a* and FIG. 3*b*.

The heat exchanger exhibits the normal important attributes such as tightly spaced copper pipes 11 and aluminum fins 12 to provide excellent heat transfer. But this design also maximizes flow and has no flow restrictors. Unlike mechanical compressor systems that have a flow restrictor known as a Thermal Expansion Valve (TXV) that restricts and monitors fluid flow through the evaporator, this design has no flow restrictions whatsoever. The inlet pipe 2 has an inside diameter of ½ inch and 8 or more ½ inch copper pipes 11 are attached to inlet pipe 2. The copper pipes 11 create a serpentine like flow throughout the heat exchanger 3 providing 40 or more horizontal copper pipe 11 flow paths throughout the heat exchanger 3. As the liquid changes to a gas and expands, a one inch or larger copper outlet pipe 5 collects the exhaust. Outlet pipe 5 is connected to a 2 inch exhaust line 7. This design minimizes flow restrictions that would significantly decrease nitrogen flow. It also continually increases the flow cross sectional area, which reduces pressure points and allows for more continual liquid flow. These design features make this device possibly the fastest cooling, portable room blast chiller.

During operation, the device uses significant amounts of liquid nitrogen in order to accomplish nearly instantaneous cooling. As a by-product, the liquid nitrogen converts to a gas in the heat exchanger 3 at an expansion rate of 696 times the liquid volume. Typical liquid nitrogen usage in the room portable blast chiller of 1.25 gallons per minute produces 116 cubic feet per minute of gaseous nitrogen, that will pass through the exhaust line 7. As a precaution, an oxygen sensor 9 will sound an alarm if exhaust gas flows into the cooling room, and nitrogen gas drops the oxygen level to a dangerously low level for biological occupants.

Figure 4:
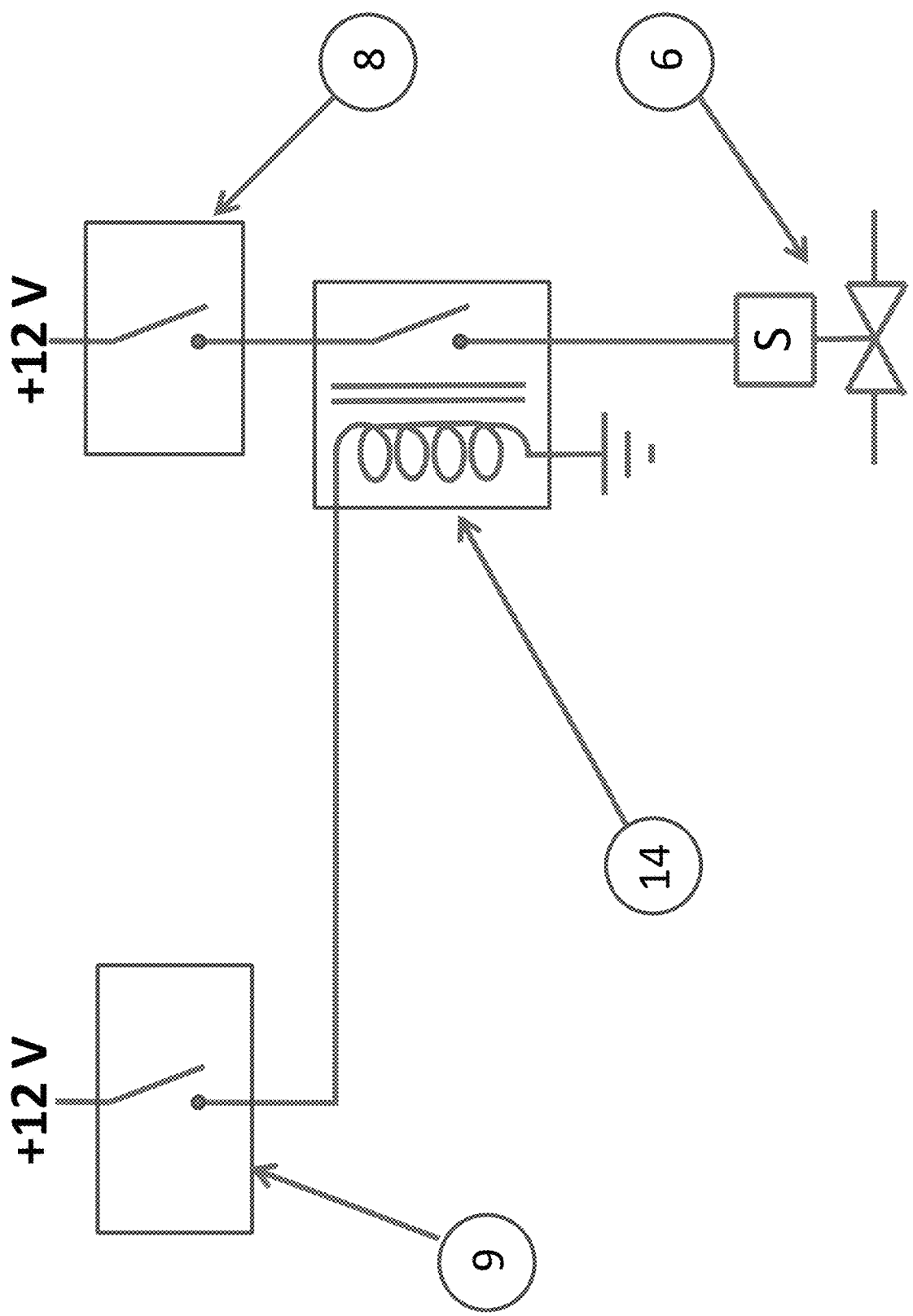
FIG. 4 shows an exemplary schematic of the fail-safe oxygen sensing system.

FIG. 4 is a schematic of the fail-safe oxygen sensing circuit. When the room portable blast chiller is turned on, the oxygen levels in the room will typically be at or above 20%. When the oxygen sensor 9 determines the oxygen level is acceptable it closes a switch inside oxygen sensor 9 which energizes relay 14. Relay 14 is a solenoid switch that is in series between thermostat 8 and solenoid valve 6. When relay 14 is energized by the oxygen sensor 9, thermostat 8 will have complete control of solenoid valve 6, which controls the liquid nitrogen through heat exchanger 3, and cools the room to a predetermined set point. However, when there is a depletion of oxygen in the room, oxygen sensor 9 will open the switch inside oxygen sensor 9, which will open relay 14. With relay 14 open, solenoid valve 6 will de-energize, independent of whether thermostat 8 is demanding cooling or not. Thus, the oxygen sensor 9 overrides the thermostat 8 in all cases.

Oxygen sensors typically function properly for about 2 years. If the oxygen sensor 9 in the room portable blast chiller failed, it would de-energize the switch in the oxygen sensor 9. This would de-energize relay 14, causing solenoid 6 to also be de-energized. Nitrogen would cease to flow, even when thermostat 8 called for cooling, thus making it a fail-safe oxygen sensing system, independent of the thermostat's 8 call for cooling or a failure of the oxygen sensor 9.

The room portable blast chiller is easy to set up, very portable, very reliable with no moving parts except for the fans, and safe. The combination of using one of the coldest cryogens as a cooling medium, and a heat exchanger, specially designed for high liquid nitrogen flow and for keeping the nitrogen in the liquid phase as long as possible in the heat exchanger qualify this device as possibly the fastest room portable blast chiller.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on memory or other machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products or memory comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A portable blast chiller system for an enclosed facility, comprising:
   a moveable platform;
   a vacuum-insulated-cryogenic tank positioned on the platform;
   a heat exchanger connected to the vacuum-insulated-cryogenic tank, the heat exchanger having a vertical inlet coupled in parallel to a plurality of equal size horizontal tubes each traversing a width of the heat exchanger and further coupled in parallel to a vertical outlet pipe with an outlet diameter at least twice an inlet tube diameter;
   a temperature sensor;
   a thermostat that monitors the temperature sensor and maintains a predetermined temperature set point by communicating with a solenoid valve coupled to the heat exchanger;
   an exhaust line coupled to the outlet pipe that expels exhaust gas outside the enclosed facility;

multiple fans attached to the heat exchanger; and a fail-safe oxygen sensor to protect a biological object in the enclosed facility.

2. The system of claim 1, comprising a power supply connected to the fans, thermostat, solenoid valve and the fail-safe oxygen sensor.

3. The system of claim 1, wherein the platform comprises wheels or motors to move the platform.

4. The system of claim 1, wherein upon detecting a predetermined oxygen level, the oxygen sensor closes a switch and energizes a relay between the thermostat and the solenoid valve to control cryogen flow.

5. The system of claim 1, comprising liquid nitrogen in the cryogenic tank.

6. The system of claim 1, wherein the solenoid valve is located downstream of the heat exchanger.

7. The system of claim 1, wherein the vertical inlet is approximately ½ inch diameter and is coupled to 8 or more equal size horizontal tubes connected in parallel to the vertical inlet, each horizontal tube having a serpentine shape that traverses a width of the heat exchanger with at least 40 horizontal paths.

8. The system of claim 1, wherein the enclosed facility comprises a room.

9. The system of claim 1, comprising a rechargeable battery to power the moveable platform.

10. The system of claim 1, wherein the moveable platform comprises a dolly.

11. A portable blast chiller system for an enclosed facility, comprising:

wall-mounting brackets;

a heat exchanger mounted to the brackets and receiving cryogen, the heat exchanger having a vertical inlet coupled in parallel to a plurality of equal size horizontal tubes each traversing a width of the heat exchanger and further coupled in parallel to a vertical outlet pipe with an outlet diameter at least twice an inlet tube diameter;

a temperature sensor;

a thermostat that monitors the temperature sensor and maintains a predetermined temperature set point by communicating with a solenoid valve coupled to the heat exchanger;

an exhaust line coupled to the outlet pipe that expels exhaust gas outside the enclosed facility;

multiple fans attached to the heat exchanger; and a fail-safe oxygen sensor to protect a biological object in the enclosed facility.

12. The system of claim 11, comprising a liquid nitrogen bulk tank located outside the enclosed facility to provide cryogen.

13. The system of claim 11, comprising a Vacuum Jacketed Piping (VJP) that connects a nitrogen bulk tank located outside the enclosed facility to the heat exchanger.

14. The system of claim 11, wherein upon detecting a predetermined oxygen level, the oxygen sensor closes a switch and energizes a relay between the thermostat and the solenoid valve to control cryogen flow.

15. The system of claim 11, comprising liquid nitrogen in a cryogenic tank.

16. The system of claim 11, wherein the solenoid valve is located downstream of the heat exchanger.

17. The system of claim 11, wherein the vertical inlet is approximately ½ inch diameter and is coupled to 8 or more equal size horizontal tubes connected in parallel to the vertical inlet, each horizontal tube having a serpentine shape that traverses a width of the heat exchanger with at least 40 horizontal paths.

18. The system of claim 11, wherein the enclosed facility comprises a room.

19. The system of claim 11, wherein the equal sized horizontal tubes comprise copper pipes.

20. The system of claim 11, wherein the enclosed facility comprises a data center.

* * * * *